United States Patent [19]

Hoenig

[11] Patent Number: 4,693,000
[45] Date of Patent: Sep. 15, 1987

[54] METHOD FOR MANUFACTURING A THREE-DIMENSIONAL GRADIOMETER FOR A DEVICE FOR THE SINGLE OR MULTI-CHANNEL MEASUREMENT OF WEAK MAGNETIC FIELDS

[75] Inventor: Eckhardt Hoenig, Erlangen, Fed. Rep. of Germany

[73] Assignee: Siemens Aktiengesellschaft, Munich, Fed. Rep. of Germany

[21] Appl. No.: 796,595

[22] Filed: Nov. 8, 1985

[30] Foreign Application Priority Data

Nov. 19, 1984 [DE] Fed. Rep. of Germany ....... 3442237

[51] Int. Cl.$^4$ ............................................ H01L 39/24
[52] U.S. Cl. ................................ 29/599; 204/192.24; 307/306; 324/248
[58] Field of Search ......................... 29/599; 324/248; 307/306; 204/192 S

[56] References Cited

U.S. PATENT DOCUMENTS 4,025,339   5/1977  Kuehnle ........................ 204/192 S
4,064,029  12/1977  Wu et al. ............................. 29/599
4,280,095   7/1981  Hinton ............................... 324/248

FOREIGN PATENT DOCUMENTS 3247543   6/1984  Fed. Rep. of Germany .

OTHER PUBLICATIONS

J. Phys. E: Sci. Instrum, vol. 13, 1980, S. J. Swithenby, pp. 801–813.
IEEE Trans. Electron Devices, vol. ED-27, No. 10, Oct. 1980, J. Clarke, pp. 1896–1908.
Biomagnetism–Proceedings Third Intl Workshop on Biomagnetism, 1981, pp. 3–31.
Rev. Sci Instrum 53(12), Dec. 1982, pp. 1815–1845.
Physica, vol. 107B(1981), pp. 29 & 30.
IEEE Trans on Magnetics, vol. MAG 19, No. 3, May 1983, pp. 835–844.
Carl Freudenberg, Simrit-Electronic Components (4 pages), Flexible Gedruckte . . .
A. Krempel Soehne GmbH, Flexible Basismaterialien, (7 pages).

Primary Examiner—Frederick R. Schmidt
Assistant Examiner—Robert Showalter
Attorney, Agent, or Firm—Kenyon & Kenyon

[57] ABSTRACT

For manufacturing a gradiometer having a three-dimensional structure for a single or multi-channel device for measuring magnetic fields with field intensities to below $10^{-10}$T, the superconducting gradiometer coils of predetermined dimensions lying in different planes are connected to each other via superconducting connecting lines and are coupled to at least one superconducting quantum interference element (SQUID). The connecting lines are designed in a simple manner. First, the gradiometer coils are applied in spaced position, with the connecting lines running between the coils, to an at least largely planar flexible substrate body. Then, the substrate body is bent such that the three-dimensional gradiometer structure is obtained. For the substrate body, a thin polyimide foil, in particular, can be used.

7 Claims, 2 Drawing Figures

METHOD FOR MANUFACTURING A THREE-DIMENSIONAL GRADIOMETER FOR A DEVICE FOR THE SINGLE OR MULTI-CHANNEL MEASUREMENT OF WEAK MAGNETIC FIELDS

BACKGROUND OF THE INVENTION

The present invention relates to a method for manufacturing a gradiometer having a three-dimensional structure for a single or multi-channel device for measuring magnetic fields with field intensities down to below $10^{-10}$ T and particularly below $10^{-12}$ T, in which the superconducting gradiometer coils of predetermined dimensions which lie in different planes are connected to each other via superconducting connecting lines and are coupled to at least one superconducting quantum interference element (SQUID). A prior art method of this type is known from DE-OS No. 32 47 543.

The use of superconducting quantum interference elements which are generally called "SQUIDs" (abbreviation for "Superconducting Quantum Interference Devices") for measuring very weak magnetic fields is generally known (J. Phys. E.: "Sci. Instrum.", Vol. 13, 1980, pages 801 to 813; "IEEE Transactions on Electron Devices", Vol. Ed.-27, No. 10, October 1980, pages 1896-1908). As a preferred field of application for these elements is therefore also considered medical technology, especially magnetocardiography and magnetoencephalography, where magnetic heart or brain waves with field strengths on the order of magnitude of 50 pT and 0.1 pT respectively occur ("Biomagnetism-Proceedings of the Third International Workshop on Biomagnetism, Berlin 1980", Berlin/New York 1981, pages 3 to 31; "Review of Scientific Instruments", Vol. 53, No. 12, December 1982, pages 1815 to 1845).

A device for measuring such biomagnetic fields contains essentially the following components:

1. A SQUID as the field-sensor proper with a so-called gradiometer,
2. A flux transformer in the form of a coil arrangement for coupling the field to be examined into the SQUID,
3. Electronic equipments for picking up and processing signals,
4. Shields for the earth's magnetic field and external interference fields, and
5. A cryo system for assuring superconductivity of the sensor and the gradiometers.

The design and operation of such single-channel devices are known. In these devices, the magnetic field to be detected, which is up to 6 orders of magnitude smaller than external interference fields, is generally coupled inductively via a three-dimensional coil arrangement into the circuit formed by an RF SQUID with a Josephson contact. Through combinations of a sensor coil, also called a detection coil, with one or more compensating coils, coil systems called first or higher-order gradiometers are realized. By appropriate manual adjustment with such gradiometers, the three components of a magnetic field which is homogeneous in the region of the coils or also its content of homogeneous gradients can be largely suppressed and the biomagnetic near field which is still heavily non-uniform in the vicinity of the gradiometers can be picked up selectively.

In order to obtain with such a device a three-dimensional field distribution, measurements must be made sequentially at different points of the region to be examined. The difficulty arises that the coherence of the field data over the measuring time required therefore is no longer assured, and in addition, clinically insufferable measuring times result. It has therefore been proposed to make a multi-channel measurement instead of the known single channel measurement (see, for instance, "Physica", Vol. 107B, 1981, pages 29 and 30). Besides an RF SQUID, each channel comprises a tunable superconducting gradiometer, the coils of which are coupled to the SQUID via connecting lines and a coupling coil, also called a coupling transformer. In such a device, however, a considerable time-consuming effort results with respect to the tuning of the individual channels, since in this device- the gradiometer on the one hand and the SQUID with its coupling coil on the other hand are each arranged on a support body of their own, where these parts can be connected to each other via detachable connecting lines. With such a connecting technique, however, constant tuning of the respective flux transformer cannot be assured from the start. Rather, an adjustment of all channels is required prior to each measurement, which also influence each other. In addition, mutual interference of the RF circuits is unavoidable in such an arrangement. While the mutual interference of the channels in an adjacent arrangement as well as the intrinsic noise of the individual channels can be reduced by the use of d-c SQUIDs instead of RF SQUIDs (see, for instance, "IEEE Transactions on Magnetics", Vol. MAG-19, No. 3, May 1983, Pages 835 to 844), the adjustment of the individual channels of a corresponding multichannel gradiometer system of modular design is difficult to control.

The three-dimensionally structured gradiometers of the known devices are generally made of superconducting wire on appropriate coil forms where it is hardly possible for the adjustment tolerances due to the manufacture to fall below approximately $10^{-3}$. An improvement of these tolerances is achieved by a subsequent mechanical adjustment. However, with this method, a realization of complex rows of gradiometers, also called gradiometer arrays, such as are required for multichannel measuring devices can be achieved only with difficulty, since a mechanical adjustment can practically not be carried out in such devices.

From DE-OS No. 32 47 543 cited above, it is furthermore known to fabricate such gradiometer arrays by a thin-film planar technique. According to this known method, the coils associated with each gradiometer are first applied by the mentioned technique in different planes of a three-dimensional substrate body. These coils must then be interlinked with each other and the SQUID(s) via separate connecting lines (FIGS. 5 to 7). While the known thin-film technique permits a better adjustment as well as the realization of more complex structures, the superconducting connecting technique required therefor is very costly.

SUMMARY OF THE INVENTION

It is therefore an object of the present invention to develop the method mentioned above such that single or multichannel measuring devices with three-dimensional gradiometers can be manufactured, the connecting lines of which can be realized in a simple manner.

The above and other objects of the present invention are achieved by a method for manufacturing a gradiometer having a three-dimensional structure for a single or multi-channel device for measuring magnetic fields with field intensities down to below $10^{-10}$ T and particularly below $10^{-12}$ T, wherein superconducting coils of the gradiometer of predetermined dimensions lying in different planes are connected to each other via superconducting connecting lines and are coupled to at least one superconducting quantum interference element (SQUID), and wherein, initially, the gradiometer coils are placed in spaced position with the connecting lines arranged therebetween on an at least largely planar, flexible substrate body and that then the substrate body is formed into the three-dimensional gradiometer structure.

The advantages connected with the method according to the invention are in particular that the gradiometer coils together with the associated connected lines can be realized with major difficulties by a thin or thick film technique as an initially planar structure. By a suitable deformation or folding technique where predetermined cuts must be placed in the still plane substrate body, the desired three-dimensional structure can then be obtained without further trouble. A subsequent costly connecting technique between the individual coils is advantageously avoided. In addition, the adjustment is also simplified accordingly thereby.

BRIEF DESCRIPTION OF THE DRAWINGS

The invention will be explained in greater detail in the following detailed description with reference to the drawings, in which.

DETAILED DESCRIPTION

Figure 1:
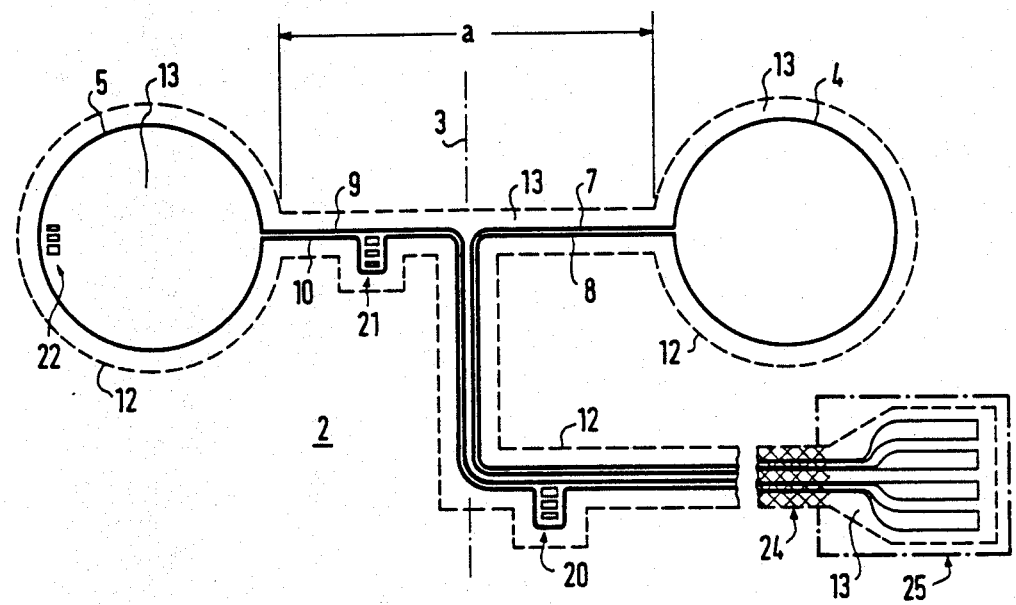
FIGS. 1 and 2 illustrate respective process steps in the manufacture of the gradiometer according to the invention.

With reference now to the drawings, according to the view schematically shown in FIG. 1, onto a sufficiently deformable plane or flexible substrate body 2, the entire structure of a gradiometer or a gradiometer array including the required feed and connecting lines is initially generated in a manner known per se as a thin or thick-film structure. For this purpose, the conductor leads are preferably made by the methods known, in particular, for making double-sided flexible circuits with through perforated contacts, by etching manganin or high-resistance bronze on a polymide substrate body 2 and subsequent lead coating for example, for instance, with an Sb-Pb alloy (see the publication of the firm C. Freudenberg-Simrit/Electronic Components, D-6940, Weinheim, with the title: "Flexible Printed Circuits"; or the publication of the firm A. Krempel Soehne, D-7000 Stuttgart, with the title: "Flexible Base Materials for Flexible Printed Circuits"). Furthermore, the individual conductor runs or leads can be formed, for instance, by sputtering of the superconductive material such as niobium and subsequent plasma etching in one to two, and optionally, in the case of the thin-film technique, also in several lithography planes. For this technique, the substrate body 2 should comprise a sufficiently heat-resistant material. Particularly well suited are thin polyimide foils such as made of Kapton (Registered Trade Mark of the firm DuPont).

Since according to the chosen embodiment the manufacture of an axial first-order gradiometer with symmetrical design is assumed, two gradiometer coils 4 and 5 which are symmetrical with respect to a line or place of symmetry 3 are realized on the flat side of the foil-like substrate body 2 at a predetermined distance from each other. On the sides facing the plane of symmetry 3, the gradiometer coils change into connecting lines 7, 8 and 9, 10, respectively, which are first brought perpendicularly to the plane of symmetry 3 and are then brought out from the region of the gradiometer coils 4 and 5 by a distance, one below the other and parallel to the plane of symmetry.

As is to be further indicated in FIG. 1, the still planar substrate foil 2 is provided with slots or cuts which facilitate or make possible the predetermined three-dimensional formation. Accordingly, after the individual conductor runs are made, a region framed by a dashed line 12, which supports the conductor runs, can be cut from the flexible substrate foil 2. This region, designated with 13, is subsequently cemented or pasted, according to the schematic oblique view shown in FIG. 2, on a suitable support body which may comprise, in particular, a special glass-like or ceramic material such as Macor (Registered Trade Mark of the firm, E+P FIBER OPTIC AG, CH-8957 Spreitenback). The material of the adhesive as well as of the substrate foil, the foil thickness and the roughness of the foil and the support body must be matched to each other such that in the operating case, tensile stresses of the foil do not lead to tearing it during a later cooling-down of the gradiometer.

For the chosen example of an axial first-order gradiometer, the support body 15 has a cylindrical or also prismatic shape with plane parallel end faces 16 and 17 spaced by the amount a and having rounded edges. The connecting lines are then brought over these edges to a separately arranged SQUID, not detailed in the figure, and in this manner between the different gradiometer planes. For this purpose, the connecting lines are sufficiently flexible.

A suitable arrangement and design of the connecting conductor runs permits a subsequent laser adjustment with regard to the x and y-components of a magnetic field to be detected by the gradiometer. The z-adjustment of the gradiometer can be made at the end face. It is assumed that the z-axis of a corresponding x-y-z coordinate system shown in FIG. 2 coincides with the cylinder axis of the support body 15, while the x and y axes subtend a central plane in which the plane of symmetry 3 according to FIG. 1 lies. As adjustment points for an x-, y- and z-compensation can be provided a multiplicity of ring structures 20, 21 and 22 of graduated size within the loop at the end face of the gradiometer coil 5 or between the corresponding outgoing and return lines 9 and 10 (see FIG. 1). These ring structures can then be severed after check measurements have been made as far as possible. If necessary, the adjustment ring structures can be produced by means of relatively precise lithography on a separate substrate foil which is then cemented to or pasted on the gradiometer foil.

The flexible connecting lines on the gradiometer block to the SQUID can advantageously be designed as double-sided strip lines for the purpose of shielding. In this connection, appropriate branchings of the strip lines bundle so obtained are necessary. Alternatively, these connecting lines can be covered for the purpose of shielding with a superconducting layer 24 at a suitable distance from the gradiometer block. The SQUID itself is advantageously arranged in a superconducting shield 25 of its own which is indicated in the figure by a dashed line and which is hermetically sealed except for an insertion slot as narrow and thin as possible for the flexible connecting lines 7 to 10. Inside this shield 25, the flexible connecting lines are advantageously made wider and are connected to the Squid via Nb-pressure contacts.

In the case of lead-coated manganin or bronze conductor runs, a lead-coated bronze wire can advantageously be soldered to the respective conductor run which is in turn connected to a niobium wire in a superconducting manner by a crimp contact. This Nb-wire can be connected to an Nb-contact spring by spot welding. Thus, the advantage is obtained that only solder joints need to be made if the gradiometer is replaced.

Figure 2:
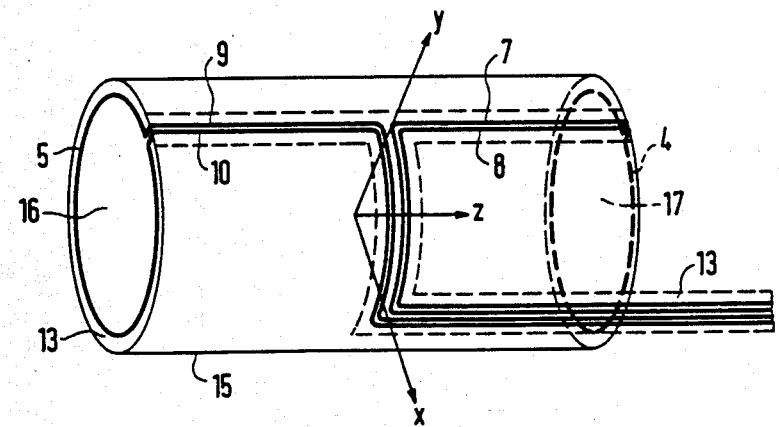

The first-order gradiometers designed in accordance with FIGS. 1 and 2 can be stacked, whereby also second-order gradiometers can be combined. Also planar first-order gradiometers can be combined in a similar manner by realizing two planes to form second-order gradiometers of the mixed axial/planar type. Similarly, gradiometer arrays can be designed.

If conductor crossings are to be generated in a second lithography plane, the region of these crossings can be advantageously concentrated at one place which need not be curved, in the method according to the invention. An additional reinforcement of this place, for instance, by a polyimide layer is advisable.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. A method for manufacturing a gradiometer having a three-dimensional structure for a single or multichannel device for measuring magnetic fields with field intensities down to below $10^{-10}$ T and particularly below $10^{-12}$ T, comprising the steps of connecting superconducting coils of the gradiometer of predetermined dimensions lying in different planes to each other via superconducting connecting lines, and coupling said superconducting coils to at least one superconducting quantum interference element (SQUID), initially placing the gradiometer coils in spaced position with the connecting lines arranged therebetween on an at least largerly planar, flexible foil substrate body; forming the foil substrate body into the three-dimensional gradiometer structure and applying the foil substrate body with the gradiometer coils and connecting lines to a support body, the shape of which corresponds to the three-dimensional gradiometer.

2. The method recited in claim 1, wherein the substrate body is made of a foil, further comprising the steps of applying said substrate body with the gradiometer coils and connecting lines to a support body, the shape of which corresponds to the three-dimensional gradiometer structure.

3. The method recited in claim 2, further comprising the step of developing conductor leads of the gradiometer coils and of the connecting lines on said foil.

4. The method recited in claim 3, further comprising the step of providing said foil of a heat-resistant material.

5. The method recited in claim 3, further comprising the step of providing as said foil a thin polyimide foil.

6. The method recited in claim 1, further comprising the step of providing the substrate body with slots or cuts which facilitate the formation of said three dimensional shape.

7. The method recited in claim 1, further comprising the step of removing regions of the substrate body prior to the step of forming said three-dimensional gradiometer structure with the exception of regions supporting conductor leads of the gradiometer coils and of regions supporting the connecting lines.

* * * * *